United States Patent
Beck et al.

(10) Patent No.: US 7,976,892 B2
(45) Date of Patent: Jul. 12, 2011

(54) METHOD FOR PRODUCING A CONDUCTIVE COATING ON AN INSULATING SUBSTRATE

(75) Inventors: Walter Beck, Uttenweiler (DE); Eric Ochs, Tübingen (DE); Walter Roethlingshoefer, Reutlingen (DE); Bernhard Bachor, Reutlingen (DE); Dietmar Schaible, Holzgerlingen (DE); Albert-Andreas Hoebel, Reutlingen (DE); Klaus-Peter Dambock, Reutlingen/Betzingen (DE); Juergen Schwaiger, Reutlingen (DE); Detlef Nitsche, Altdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/668,472

(22) Filed: Sep. 22, 2003

(65) Prior Publication Data
US 2004/0131869 A1 Jul. 8, 2004

(30) Foreign Application Priority Data
Sep. 20, 2002 (DE) .................................. 102 43 814

(51) Int. Cl.
*B05D 5/12* (2006.01)
(52) U.S. Cl. .................. 427/58; 427/304; 427/443.2
(58) Field of Classification Search ................ 427/304, 427/443.2, 58
See application file for complete search history.

(56) References Cited

U.S. PATENT DOCUMENTS

| | | | | |
|---|---|---|---|---|
| 4,002,595 A | * | 1/1977 | Adelman | 524/492 |
| 4,340,618 A | | 7/1982 | Fury et al. | |
| 4,478,692 A | * | 10/1984 | Nobel | 205/257 |
| 4,496,373 A | * | 1/1985 | Behr et al. | 205/354 |
| 5,300,735 A | * | 4/1994 | Yokono et al. | 174/264 |
| 5,849,170 A | * | 12/1998 | Djokic et al. | 205/163 |
| 5,891,606 A | * | 4/1999 | Brown | 430/312 |
| 6,054,172 A | * | 4/2000 | Robinson et al. | 427/97.2 |
| 6,372,539 B1 | * | 4/2002 | Bayan et al. | 438/106 |
| 6,406,939 B1 | * | 6/2002 | Lin | 438/108 |
| 6,448,199 B1 | * | 9/2002 | Choudhary et al. | 502/339 |
| 6,653,170 B1 | * | 11/2003 | Lin | 438/117 |
| 2003/0080392 A1 | * | 5/2003 | Zuniga-Ortiz et al. | 257/503 |
| 2003/0190486 A1 | * | 10/2003 | Roa et al. | 428/469 |

FOREIGN PATENT DOCUMENTS

| | | |
|---|---|---|
| DE | 4113263 | 10/1992 |
| GB | 1 368 960 | 10/1974 |
| JP | 56-146221 | 11/1981 |
| JP | 60-142547 | 7/1985 |
| JP | 6-132636 | 5/1994 |
| JP | 7-106736 | 4/1995 |

(Continued)

OTHER PUBLICATIONS

Productronic 8, Nov. 1995, pp. 40-46, LTCC (Low-temperature co-fired ceramic).

*Primary Examiner* — Brian K Talbot
(74) *Attorney, Agent, or Firm* — Kenyon & Kenyon LLP

(57) ABSTRACT

In a method for producing a conductive coating on an insulating substrate, at least one surface of an electrically insulating substrate is equipped, in selected regions, with a coating of an electrically highly conductive first metal; the coated surface is cleaned; the coating made of the first metal on the substrate is seeded with seeds of a second metal; a layer of the second metal is deposited onto the layer thus seeded; the substrate thus coated is fired.

20 Claims, 2 Drawing Sheets

FOREIGN PATENT DOCUMENTS

| | | |
|---|---|---|
| JP | 07-122556 | 5/1995 |
| JP | 8-32296 | 2/1996 |
| JP | 10-270831 | 10/1998 |
| JP | 11-286785 | 10/1999 |
| JP | 2000-58485 | 2/2000 |
| JP | 2000-303186 | 10/2000 |
| JP | 2000-319066 | 11/2000 |
| WO | 98/19858 | 5/1998 |

* cited by examiner

METHOD FOR PRODUCING A CONDUCTIVE COATING ON AN INSULATING SUBSTRATE

FIELD OF THE INVENTION

The invention relates to a method for producing a conductive coating on an insulating substrate.

BACKGROUND INFORMATION

In modem electronics, the trend is toward a greater and greater reduction in component sizes and toward the integration of passive components as well, so that existing requirements in terms of increasing integration density of integrated circuits can be met. One promising technology for achieving this goal is so-called low-temperature co-fired ceramic (LTCC), known for example from the periodical "productronic" 8, 1995, pp. 40 ff. LTCC refers to a glass-ceramic mixture that, together with metallization pastes made e.g. from Ag, AgPd, or Au, is fired at a relatively low temperature that is below the melting point of the aforesaid metals.

SUMMARY OF THE INVENTION

The approach to achieving the object of the present invention proposes a particularly simple and therefore economical method for producing a metal coating in the context of LTCC and ceramic substrates. Previously usual nickel and gold baths can be omitted, so that the process sequence becomes simpler and therefore also more reliable. The coatings produced using the method according to the present invention have proven to be outstandingly suitable for the production of bonding connections.

DETAILED DESCRIPTION

Figure 1:
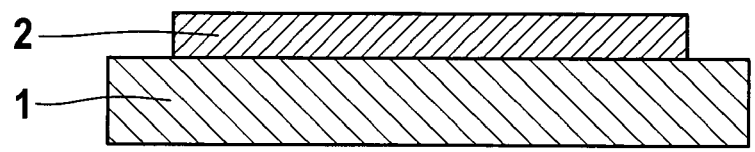
FIG. 1 shows a substrate coated locally with a layer of a first metal.
Figure 2:
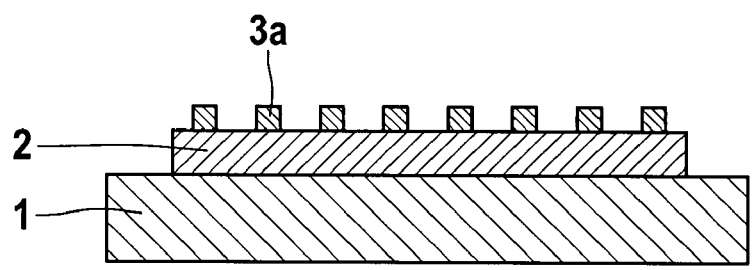
FIG. 2 shows the seeding of the layer of the first metal with a second metal.
Figure 3:
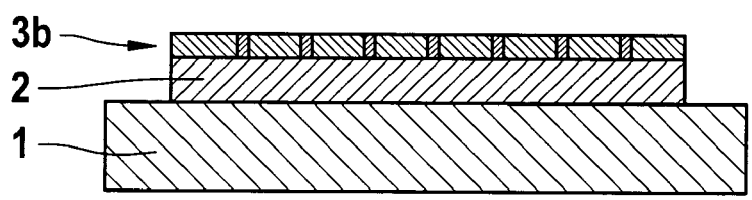
FIG. 3 shows the substrate with a layer of the second metal on the layer of the first metal.
Figure 4:
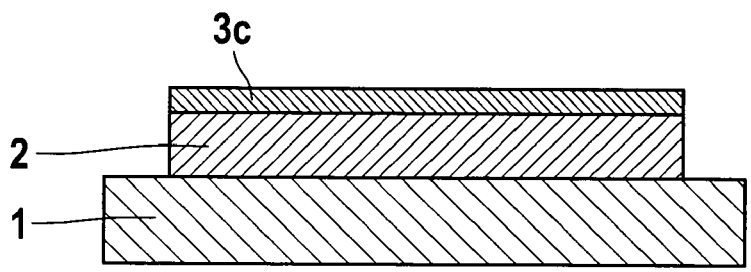
FIG. 4 shows the substrate with a metal coating after a firing operation.
Figure 5:
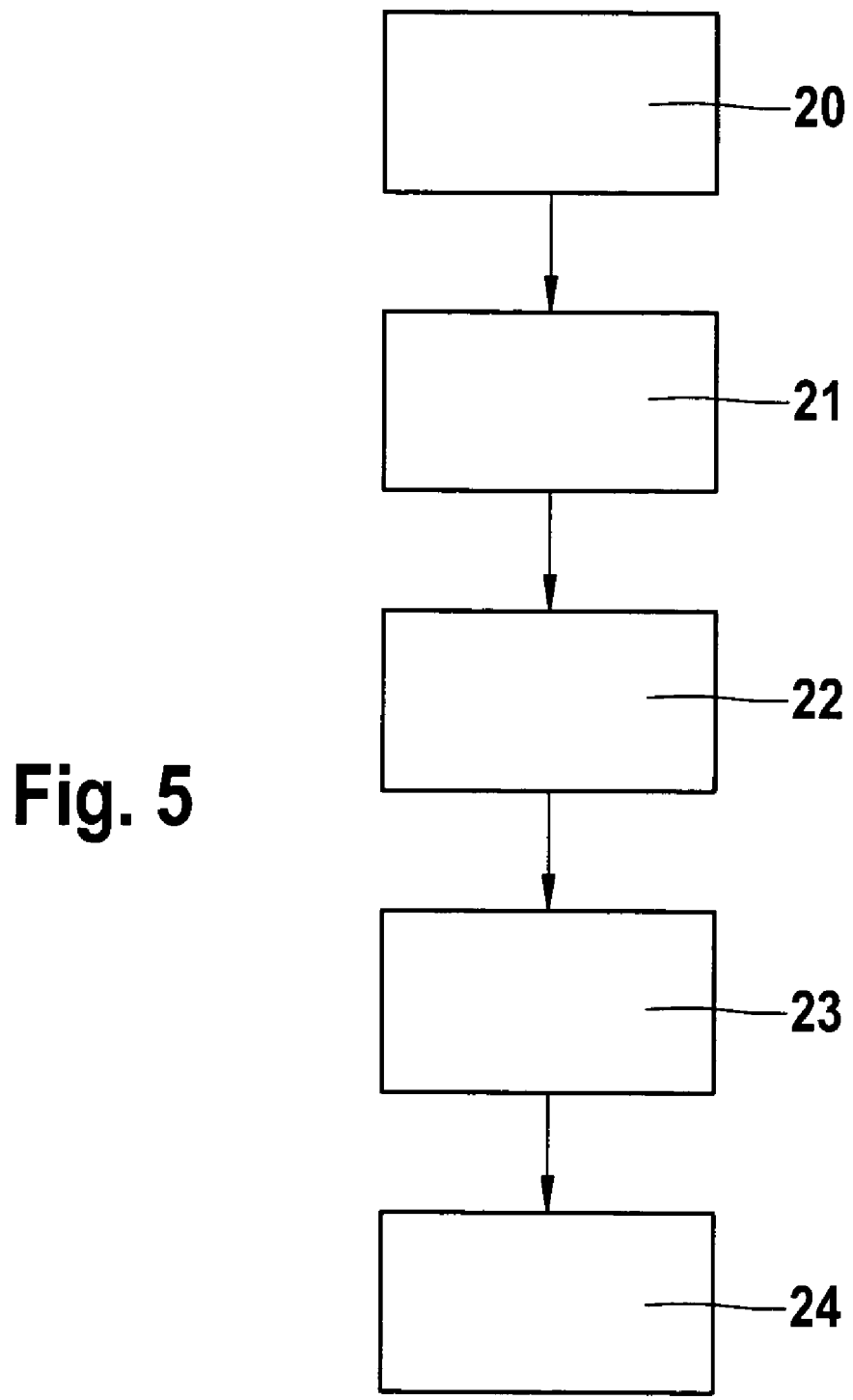
FIG. 5 shows a flow chart depicting the process sequence.

The method is based on an electrically insulating substrate 1 that is coated locally with a layer of a first metal 2 (FIG. 1 and step 20 in FIG. 5). A substrate made of conventional ceramic is suitable as substrate 1. A substrate made of LTCC, however, is particularly well suited. Silver, in particular, is suitable as the first metal. First metal 2 is structured in such a way that is only locally covers at least one main surface of substrate 1. In particular, the layer made of first metal 2 has the structure of conductor paths that extend on a main surface of substrate 1. In a following method step (step 21 in FIG. 5), the electrically insulating substrate 1 coated with first metal 2 is first thoroughly cleaned. A standard cleaner that is usual in electroplating technology, intended to eliminate troublesome contaminants on the surface of the substrate, is used for this cleaning. A cleaner with sodium acetate trihydrate has proven particularly well suited. In the next method step (step 22 in FIG. 5), a seed layer 3a (FIG. 2) of a second metal is applied onto the cleaned surface of layer 2. Palladium is preferably used for the seeding to produce seed layer 3a. This is deposited in electroless fashion onto the first metal. In practice, a thickness of a few atomic layers has proven useful in this context. In a subsequent method step (step 23 in FIG. 5), a continuous layer 3b of the second metal is produced by further electroless deposition of palladium proceeding from seed layer 3a in FIG. 2, covering the surface of layer 2 of the first metal on substrate 1. In this coating operation, a palladium layer is advantageously deposited at a ratio of 0.1 to 50%. In other words, after the diffusion operation the concentration of palladium present in the silver is from approximately 0.1 to about 50 percent by weight. An AgPd alloy having a palladium content greater than about 20-25% has proven particularly advantageous. This is because it offers particularly good corrosion protection and good resistance to silver migration. The leaching resistance in the solder bath is also distinctly better with an alloy of this kind than with a pure silver conductor path. This results in outstanding solderability. In a concluding method step (step 24 in FIG. 5), coated substrate 1 is fired. The firing operation is performed at a temperature from 830 to 870° C., in particular at a temperature of 850° C. This firing operation is preferably performed in a continuous or batch furnace. What is created as the result of the firing operation is the layered structure depicted in FIG. 4, in which layer 2 of the first metal (silver) is located on substrate 1, and in which a layer 3c of the second metal (palladium) is present on layer 2 of the first metal. A polished section of the layered structure shows that the firing operation does not result in a complete mixing of the silver of layer 2 with the palladium of layer 3b. Diffusion of the palladium into the silver layer is clearly evident from the polished section.

The layer produced using the method according to the present invention is outstandingly suitable as a contact surface for thin-wire bonding connections. It has been possible to produce extraordinarily reliable bonding connections using thin gold bonding wire (diameter 25 to 50 μm). The bonding results are comparable to bonding on AgPd conductor path pastes.

An insulating substrate with a conductive coating produced using the method according to the present invention is thus made up of ceramic or LTCC with a conductive coating of silver and palladium, the palladium content of the conductive coating being between 0.1 and 50, in particular >20, percent by weight.

List of Reference Characters
1 Substrate
2 First metal
3a Seed layer of second metal
3b Layer of second metal
3c Metal layer
20 First method step: preparing partially coated substrate
21 Second method step: cleaning
22 Third method step: seeding
23 Fourth method step: coating
24 Fifth method step: firing.

What is claimed is:

1. A method for producing a conductive layered coating on an insulating substrate, comprising:
    equipping, in selected regions, at least one surface of an electrically insulating substrate with a coating of an electrically highly conductive first metal, the coating being structured as conductor paths;
    structuring the first metal to cover locally the at least one surface of the substrate;
    cleaning the at least one coated surface;
    seeding the coating with seeds of a second metal;

depositing a first layer including an alloy of the second metal onto the coating seeded with the seeds of the second metal;

depositing a second continuous layer including the alloy of the second metal onto the coating seeded with the seeds of the second metal, the second continuous layer covering the first layer;

firing the substrate deposited with the first and second layers of the second metal to form the conductive layered coating, the firing being performed so that the first metal is diffused with the second metal; and contacting a gold bonding wire to the conductive layered coating, wherein the substrate includes a low-temperature co-fired ceramic (LTCC), the first metal includes silver, and the second metal includes palladium.

2. The method as recited in claim 1, wherein in the depositing of the second layer of the second metal, palladium is deposited at a ratio of from 0.1 to 50% percent by weight of the alloy.

3. The method as recited in claim 1, wherein in the depositing of palladium, the palladium is deposited so that a concentration of greater than 20% percent by weight palladium in the alloy results.

4. The method as recited in claim 1, wherein the seeding and the depositing are performed according to an electroless procedure.

5. The method as recited in claim 1, wherein the firing is performed at a temperature between 830 and 870° C.

6. The method as recited in claim 1, wherein the firing is performed at a temperature of 850° C.

7. A method for producing a conductive layered coating on an electrically insulating substrate, comprising:

equipping, in selected regions, at least one surface of the electrically insulating substrate with a coating of a first metal structured as a conductor path;

structuring the first metal to cover locally the at least one surface of the substrate;

cleaning the at least one coated surface;

seeding the at least one coated surface with seeds of a second metal;

depositing a first layer including an alloy of the second metal onto the at least one seeded coated surface;

depositing a second continuous layer including an alloy of the second metal onto the at least one seeded coated surface, the second continuous layer covering the first layer; and firing the substrate deposited with the first and second layers to form the conductive layered coating, the firing being performed at a temperature below the melting point of the first metal, the second metal and the alloy.

8. The method of claim 7, wherein the substrate includes an LTCC.

9. The method of claim 8, wherein the first metal includes silver and the second metal includes palladium.

10. The method of claim 9, further comprising:
contacting a gold bonding wire to the conductive coating.

11. The method of claim 9, wherein the low-temperature co-fired ceramic (LTCC) is a glass-ceramic mixture that, together with metallization pastes made from silver (Ag), silver palladium (AgPd) or gold (Au), is fired at a temperature that is below the melting point of the metallization pastes.

12. The method of claim 9, wherein a nickel bath is not used and a gold bath is not used, and wherein the low-temperature co-fired ceramic (LTCC) is a glass-ceramic mixture that, together with metallization pastes made from silver (Ag), silver palladium (AgPd) or gold (Au), is fired at a temperature that is below the melting point of the metallization pastes.

13. The method of claim 12, wherein:
in the depositing of the layer of the second metal, palladium is deposited at a ratio of from 0.1 to 50% percent by weight of the alloy,
in the depositing of palladium, the palladium is deposited in such a way that a concentration of greater than 20% percent by weight palladium in the alloy results, and
the firing is performed at a temperature between 830 and 870° C.

14. The method of claim 13, wherein the seeding and the depositing are performed according to an electroless procedure, and the firing is performed at a temperature of 850° C.

15. The method of claim 1, wherein the low-temperature co-fired ceramic (LTCC) is a glass-ceramic mixture that, together with metallization pastes made from silver (Ag), silver palladium (AgPd) or gold (Au), is fired at a temperature that is below the melting point of the metallization pastes.

16. The method of claim 1, wherein a nickel bath is not used and a gold bath is not used, and wherein the low-temperature co-fired ceramic (LTCC) is a glass ceramic mixture that, together with metallization pastes made from silver (Ag), silver-palladium (AgPd) or gold (Au), is fired at a temperature that is below the melting point of the metallization pastes.

17. The method of claim 16, wherein:
in the depositing of the layer of the second metal, palladium is deposited at a ratio of from 0.1 to 50% percent by weight of the alloy,
in the depositing of palladium, the palladium is deposited in such a way that a concentration of greater than 20% percent by weight palladium in the alloy results, and
the firing is performed at a temperature between 830 and 870° C.

18. The method of claim 17, wherein the seeding and the depositing are performed according to an electroless procedure, and the firing is performed at a temperature of 850° C.

19. The method of claim 1, wherein the palladium process is performed on circuit traces formed on a surface of the substrate surface.

20. The method of claim 7, wherein the palladium process is performed on circuit traces formed on a surface of the substrate surface.

* * * * *